(12) United States Patent
Esaki

(10) Patent No.: US 6,275,553 B1
(45) Date of Patent: *Aug. 14, 2001

(54) DIGITAL PLL CIRCUIT AND CLOCK GENERATION METHOD

(75) Inventor: Takafumi Esaki, Kanagawa (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,354

(22) Filed: Feb. 10, 1999

(30) Foreign Application Priority Data

Feb. 12, 1998 (JP) .................................. 10-029586

(51) Int. Cl.[7] .................................................. H04L 25/36
(52) U.S. Cl. .......................... 375/371; 375/376; 327/147; 327/151; 327/152; 331/2; 331/60
(58) Field of Search ..................................... 375/374, 375, 375/376; 327/147, 151, 152; 331/2, 11, 20, 25, 60, 61

(56) References Cited

U.S. PATENT DOCUMENTS

| | | | |
|---|---|---|---|
| 5,038,115 | * | 8/1991 | Myers et al. ............................... 331/2 |
| 5,194,828 | * | 3/1993 | Kato et al. ............................ 331/1 A |
| 5,355,037 | * | 10/1994 | Andresen et al. .................... 307/602 |
| 5,389,898 | * | 2/1995 | Taketoshi et al. ........................ 331/2 |
| 5,561,398 | * | 10/1996 | Rasussen ................................ 331/36 |
| 5,686,864 | * | 11/1997 | Martin et al. ......................... 331/1 A |
| 5,742,208 | * | 4/1998 | Blazo ..................................... 331/23 |
| 5,889,436 | * | 3/1999 | Yeung et al. ............................. 331/2 |
| 5,974,105 | | 10/1999 | Wang et al. . |
| 5,997,806 | * | 8/2000 | Kikuchi ................................. 327/157 |
| 6,078,317 | * | 6/2000 | Sawada ................................. 345/204 |
| 6,104,222 | * | 8/2000 | Embree ................................. 327/156 |
| 6,118,316 | * | 9/2000 | Tamamura et al. ................... 327/156 |

FOREIGN PATENT DOCUMENTS

| | | |
|---|---|---|
| 57-154946 | 9/1982 | (JP) . |
| 1-243620 | 9/1989 | (JP) . |
| 1-265721 | 10/1989 | (JP) . |
| 2-14618 | 1/1990 | (JP) . |
| 3-97318 | 4/1991 | (JP) . |
| 3-153124 | 7/1991 | (JP) . |
| 4-282917 | 10/1992 | (JP) . |
| 6-112814 | 4/1994 | (JP) . |
| 7-107240 | 4/1995 | (JP) . |
| 8-125884 | 5/1996 | (JP) . |
| 8-274629 | 10/1996 | (JP) . |
| 9-130237 | 5/1997 | (JP) . |
| 289883 | 11/1996 | (TW) . |

* cited by examiner

Primary Examiner—Stephen Chin
Assistant Examiner—Dac V. Ha (57) ABSTRACT

A digital PLL circuit is formed by a first digital PLL circuit, a signal generation circuit that generates a plurality of signals that have the same frequency as the output of the first PLL circuit but differing phases, and the second digital PLL circuit having a signal selecting circuit that can select the signals from the signal generation circuit, a frequency divider circuit that divides the output signal of the signal selecting circuit, a phase comparator circuit that compares the phase between the a signal used as a reference and the output signal from the frequency divider circuit, an up/down counter that detects the phase difference of the phase comparison circuit, and a digital filter that is provided between the up/down counter and the signal selecting circuit, the second PLL circuit selecting the signals from the signal generation circuit based on the output from the up/down counter.

10 Claims, 6 Drawing Sheets

(a) CASE IN WHICH HORIZONTAL SYNC SIGNAL IS EARLIER THAN FREQUENCY-DIVIDED OUTPUT (b) CASE IN WHICH HORIZONTAL SYNC SIGNAL IS LATER THAN FREQUENCY-DIVIDED OUTPUT

DIGITAL PLL CIRCUIT AND CLOCK GENERATION METHOD

FIELD OF THE INVENTION

The present invention relates to a digital PLL circuit and a clock generation method, and more particularly to a digital PLL circuit that provides immunity with respect to, for example, externally introduced noise or power supply noise, and which also enables the output of a stable clock with a constant phase.

BACKGROUND OF THE INVENTION

In a display apparatus that is connected to a computer, display is performed in synchronization with external vertical and horizontal synchronization signals. In particular, a clock of high accuracy is required to control the horizontal scanning lines based on the horizontal synchronization signal, and unless a jitter-free clock is provided, the display will be distorted or will undulate.

Figure 9:
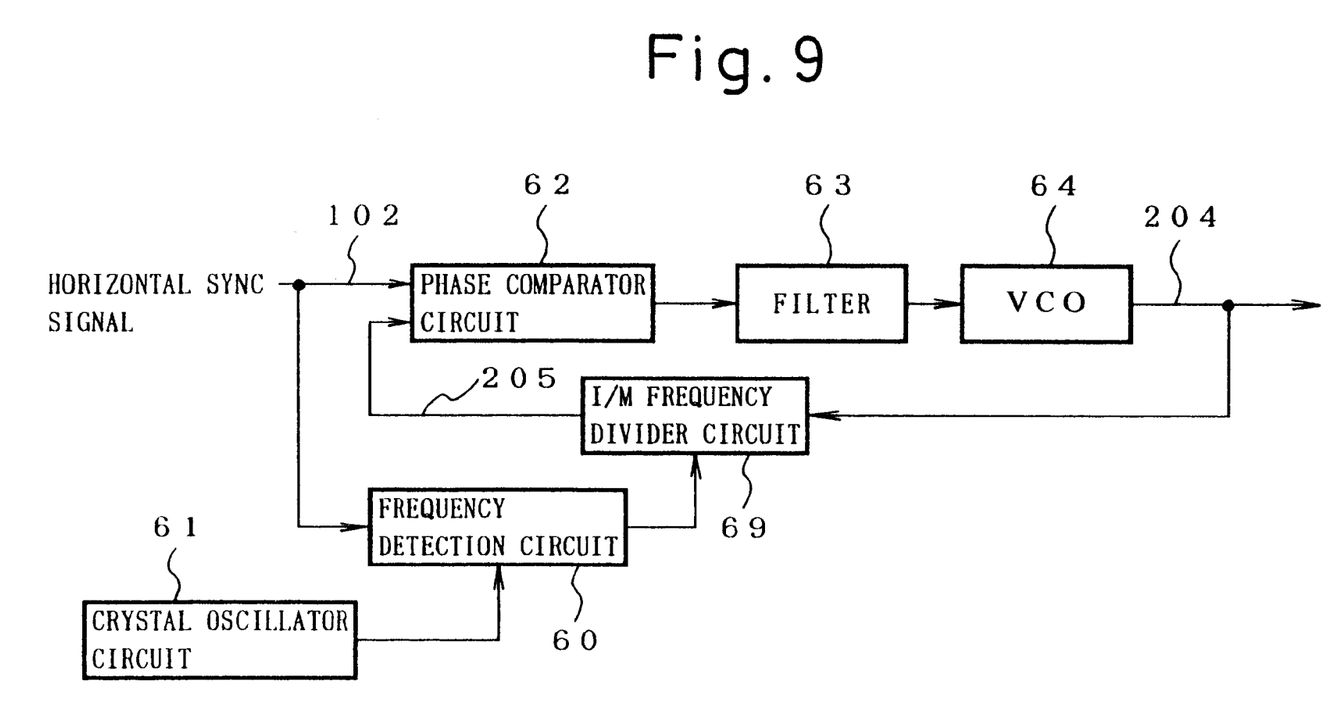
FIG. 9 is a block diagram that shows the prior art.

A circuit of the past is shown in FIG. 9, this circuit being formed by a crystal oscillator circuit 61, a frequency detection circuit 60, a phase comparator circuit 62, a filter 63, a VCO (voltage controlled oscillator) 64, and a 1/M frequency divider circuit 69.

The frequency detection circuit 60 counts the period of the horizontal synchronization signal 102 with the clock of the crystal oscillator circuit 61 that oscillates at a known frequency, and sets the divisor of the 1/M frequency divider circuit 69.

The phase of the output 205 of the 1/M frequency divider circuit 69 is compared to the phase of the horizontal synchronization signal 102 by the phase comparator circuit 62, the results thereof being smoothed by the filter 63, and used to control the VCO 64.

In this circuit, which is known as a phase-locked loop circuit, because a voltage that is smoothed by the filter 63 establishes the oscillation frequency of the VCO 64, if external noise or power supply noise is allowed to be superimposed, a variation will occur in the oscillation frequency of the VCO 64, thereby causing jitter in the system clock 204.

Additionally, regarding the frequency of the system clock 204 that is required with respect to the frequency of the horizontal synchronization signal 102 that is input, the divisor M of 1/M frequency divider circuit 69 is several thousand, so that the phase comparison is only performed for one clock out of several thousand clocks, the result being that it is difficult to apply feedback of the phase comparison results, thereby requiring time for the frequency to settle back to the original frequency when it is caused by change by external noise, this manifesting itself as noise-caused jitter.

A known technology for lessening the above-noted jitter is disclosed in the Japanese Unexamined Patent Publication (KOKAI) H2-14618.

Accordingly, it is an object of the present invention to provide a novel PLL circuit and clock generation method that improves on the above-noted problems, which particularly provides immunity with respect to external noise and power supply noise, and also enables the output of a stable clock with a constant phase.

SUMMARY OF THE INVENTION

In order to achieve the above-noted objects, the present invention adopts the following basic constitution.

Specifically, a first aspect of a digital PLL circuit according to the present invention has a first PLL circuit comprising a reference oscillator, a voltage-controlled oscillator and a 1/N frequency divider which divisor is unvaried, said 1/N frequency divider dividing the oscillation output of said voltage-controlled oscillator by means of said 1/N frequency divider, comparing the phases of an output signal of said 1/N frequency divider and an output signal of said reference oscillator, controlling the oscillation frequency of said voltage-controlled oscillator, and extracting an oscillation output of said voltage-controlled oscillator; a signal generation circuit generating a plurality of output signals having the same frequency as a frequency from said voltage-controlled oscillator of said first digital PLL circuit but differing phase; a second digital PLL circuit comprising a signal selecting circuit that is capable of selecting a signal from said signal generation circuit, a variable frequency divider circuit that divides the frequency of an output of said signal selecting circuit, a phase comparator circuit that compares the phases of a reference signal and the output signal from said variable frequency divider circuit, an up/down counter that detects a difference in phase of said phase comparator circuit, a digital filter that is provided between said up/down counter and said signal selecting circuit, this second PLL circuit selecting the signal from said signal generation circuit based on the output of said up/down counter, a clock that is synchronized with the phase of said reference signal being obtained by said second PLL circuit, and said clock being phase-compared N times by said first digital PLL circuit in a time between two of said reference signal.

In a second aspect of the digital PLL circuit according to the present invention, said voltage-controlled oscillator of said first digital PLL circuit is formed by a loop connection of an odd number of inverter circuits in cascade, and said first digital PLL circuit forming so as to following relationship between the allowable jitter time of said clock, oscillation period of said reference oscillator, the divisor of the 1/N frequency divider circuit, and the number of inverter circuit stages of said voltage-controlled oscillator(VCO).

Allowable clock jitter time

>(Reference oscillator period)/{( Divisor of 1/N frequency divider)×(Number of inverter circuit stages in VCO)×2}

In a third aspect of the digital PLL circuit according to the present invention, said signal generation circuit is configured so as to extract several signals having differing phases from connection lines between said inverter circuits, and said signals of differing phase by 180 degrees are extracted from said connection lines.

In a fourth aspect of the digital PLL circuit according to the present invention, said signal selecting circuit is provided with a switching means for the purpose of selecting one signal from a plurality of signals having differing phases, said signals being output from said signal generation circuit.

In a fifth aspect of the digital PLL circuit according to the present invention, said reference signal in said second digital PLL circuit is a horizontal synchronization signal.

One aspect of a method of generating a clock in a digital PLL circuit according to the present invention is that a plurality of signals having differing phases are generated from a first digital PLL circuit which is provided with unvaried frequency divider, a prescribed signal being selected from said plurality of signals, said selected signal being divided by variable frequency divider of a second digital PLL circuit, the phase of said divided signal being compared by a phase comparator circuit of a second digital PLL circuit with the phase of a reference signal and, based on a result of said comparison, a signal being selected from said plurality of signals so as to eliminate said phase difference between said divided signal and said reference signal, thereby obtaining a clock that is synchronized to the phase of said reference signal.

This PLL circuit is formed by a first PLL circuit and a second PLL circuit, the voltage-controlled oscillator of the first PLL circuit generating output signals having the same frequency but each phase is different, the second PLL circuit selecting one of the plural output signals of the first PLL circuit so as to eliminate the phase difference between the reference signal and the output signal of the first PLL circuit that are input to the second PLL circuit phase comparator.

Figure 1:
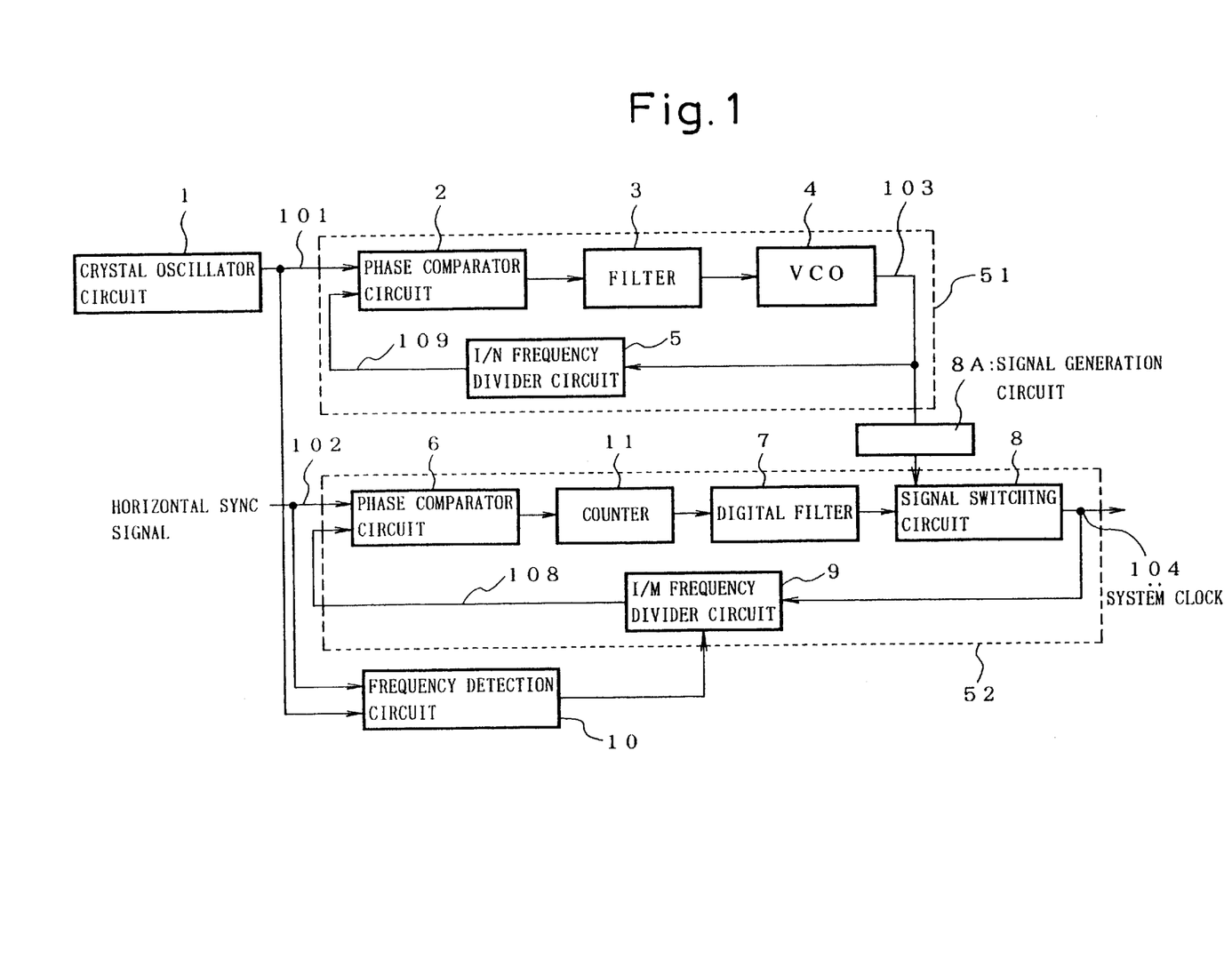
FIG. 1 is a block diagram of the present invention.

That is, the present invention has a crystal oscillator circuit as the reference clock, the oscillation clock 101 thereof being multiplied by the first digital PLL circuit 51, and the resulting output reference clock 103 therefrom being switched by the signal switching circuit 8 of the second digital PLL circuit 52 so as to obtain a system clock 104 that has a phase that is matched to the phase of the horizontal synchronization signal 102.

The first digital PLL circuit 51 is formed by a phase comparator circuit 2, a filter 3, a voltage-controlled oscillator (VCO) 4, and a 1/N frequency divider circuit 5. In particular, by implementing the VCO 4 using an odd number of inverter circuit stages, a plurality of reference clocks 103 are generated that have differing phases and which are multiples N by the oscillation clock 101 of the crystal oscillator circuit 1.

The second digital PLL circuit 52 is formed by a phase comparator 6, an up/down counter 11, a digital filter 7, a signal switching circuit 8, and a 1/M frequency divider circuit 9. The reference clocks 103 that is output from the first PLL circuit 51 are selected by the signal switching circuit 8 to obtain a system clock 104 that has a phase that matches the phase of the horizontal synchronization signal.

The frequency detection circuit 10 counts the period of the horizontal synchronization signal 102 using the clock of the crystal oscillator circuit 1 that oscillates at a known frequency, this being used to set the divisor of the 1/M frequency divider circuit 9.

DETAILED DESCRIPTION

Embodiments of a digital PLL circuit according to the present invention are described below, with references being made to relevant accompanying drawings.

FIG. 1 is a block diagram that shows a specific example of a digital PLL circuit according to the present invention. This drawing shows a digital PLL circuit that has a first PLL circuit 51 that divides the oscillation output of a voltage-controlled oscillator 4 by a 1/N frequency divider 5, compares the phases of this divided signal 109 and the output signal 101 of a reference oscillator controls the oscillation frequency of the voltage-controlled oscillator 4, and extracts the oscillation output of this voltage-controlled oscillator 4, a signal generation circuit 8A that generates a plurality of output signals having the same frequency but different phase, and a second digital PLL circuit 52 that has a signal selecting circuit 8 that is capable of selecting an output signal from the signal generation circuit 8A, a 1/M frequency divider circuit 9 that divides the frequency of the output signal 104 of the signal switching circuit 8, a phase comparator circuit 6 that compares the phases of the signal (horizontal synchronization signal) 102 that is used as a reference and the output signal 108 of the 1/M frequency divider circuit 9, an up/down counter 11 that detects the difference in phase of phase comparator circuit 6, and a digital filter 7 that is provided between the up/down counter 11 and the signal selecting circuit 8, this second digital PLL circuit 52 switching a signal from the above-noted signal generation circuit 8 based on the output of the up/down counter 11, a system clock 104 that is synchronized with the phase of the above-noted reference signal 102 being obtained by this second digital PLL circuit 52, and a system clock 104 that is compared the phase N times by the first digital PLL circuit 51 in the time between the reference signals being obtained.

The voltage-controlled oscillator 4 of the first digital PLL circuit 51 is in the configuration of a loop of an odd number of inverter circuits connected in cascade, and the signal generation circuit 8A is configured so as to extract signals 103-A through 103-F, which have different phases, from connection lines J between the above-noted inverter circuits.

Figure 2:
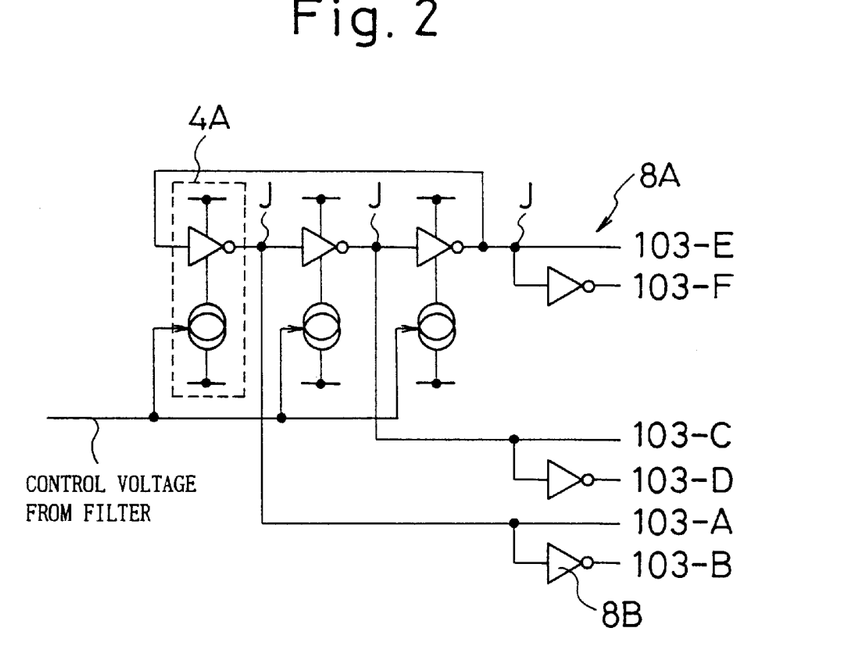
FIG. 2 is a circuit diagram of a specific configuration of a voltage-controlled oscillator (VCO).

In the specific example of the configuration of the VCO 4, shown in FIG. 2, the example is that in which the signals 103-A and 103-B(103-C and 103-D), which have phases that differ by 180 degrees, are extracted from the above-noted connection lines J.

The present invention is described in further detail below.

At the first digital PLL circuit 51, the period and phase of the oscillation clock 101 from the crystal oscillator circuit 1 and the phase comparison signal 109 from the 1/N frequency divider circuit 5 are compared by the phase comparator circuit 2. The phase comparator circuit 2 and filter 3 operate so as to lower the oscillation frequency of the voltage-controlled oscillator (VCO) 4 if the period of the phase comparison signal 109 is shorter than the oscillation clock 101. On the other hand, if the period of the phase comparison signal 109 is longer than the oscillation clock 101, the phase comparator circuit 2 and filter 3 act so as to raise the oscillation frequency of the VCO 4.

Then, the reference clock 103, which is the output of the VCO 4, is output to the signal selecting circuit 8, and is also output to 1/N frequency divider circuit 5 and returned to the phase comparator circuit 2, this arrangement forming the first digital PLL circuit 51.

In the second digital PLL circuit 52, the phase comparator circuit 6 compares the phase of the horizontal synchronization signal 102 and the output 108 of the 1/M frequency divider circuit 9. The up/down counter 11 counts the comparison results of the phase comparator circuit 6, filtering is applied by the digital filter 7, the signal selecting circuit 8 being controlled, and, by selecting a signal with a matching phase from the plurality of reference clock signals 103 from the first digital PLL circuit 51, a system clock 104 having no jitter is output, this system clock 104 being frequency-divided by the 1/M frequency divider circuit 9 and returned to the phase comparator circuit 6, thereby forming the second digital PLL circuit 52.

Turning to FIG. 2, which shows the circuit of the VCO 4 in the first embodiment of the present invention, in this case three stages of inverter circuits 4A are connected in cascade so as to enable adjustment of phase by forming an oscillating loop, a total of six signals, the signals 103-A through 103-F, which are taken as outputs from the inverter circuits 4A in groups of signals having phases that differ by 180 degrees, being output to the signal selecting circuit 8.

In this case, a reference clock 103-B having a phase difference of 180 degrees with respect to the reference clock 103-A is generated by providing the inverter 8B.

Figure 3:
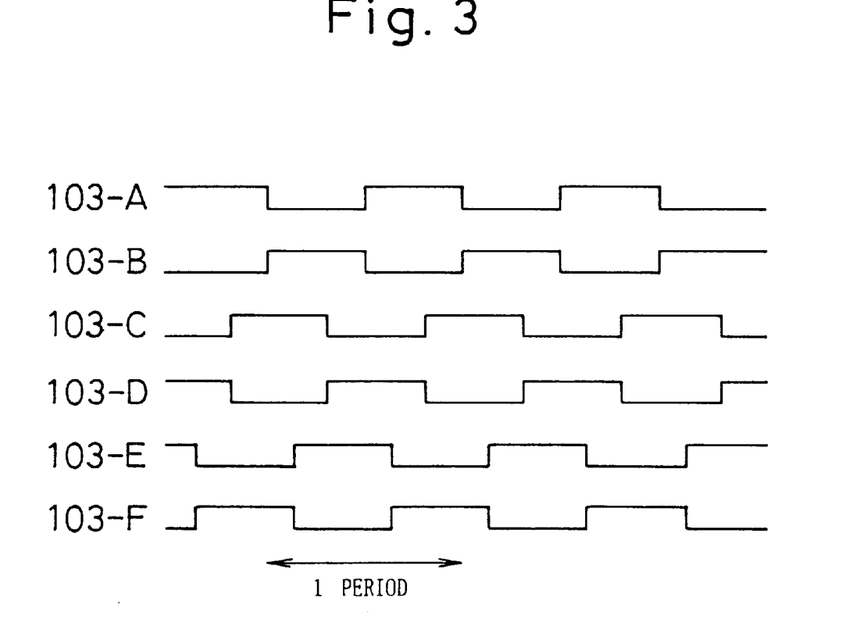
FIG. 3 is a timing diagram of the signals output by the voltage-controlled oscillator.

FIG. 3 is a timing diagram that illustrates the operation of the VCO 4. The six reference clocks each have phase differences, there being a 60-degree phase difference therebetween, in the sequence of 103-A, 103-F, 103-C, 103-B, 103-E, 103-D, and 103-A.

Figure 4:
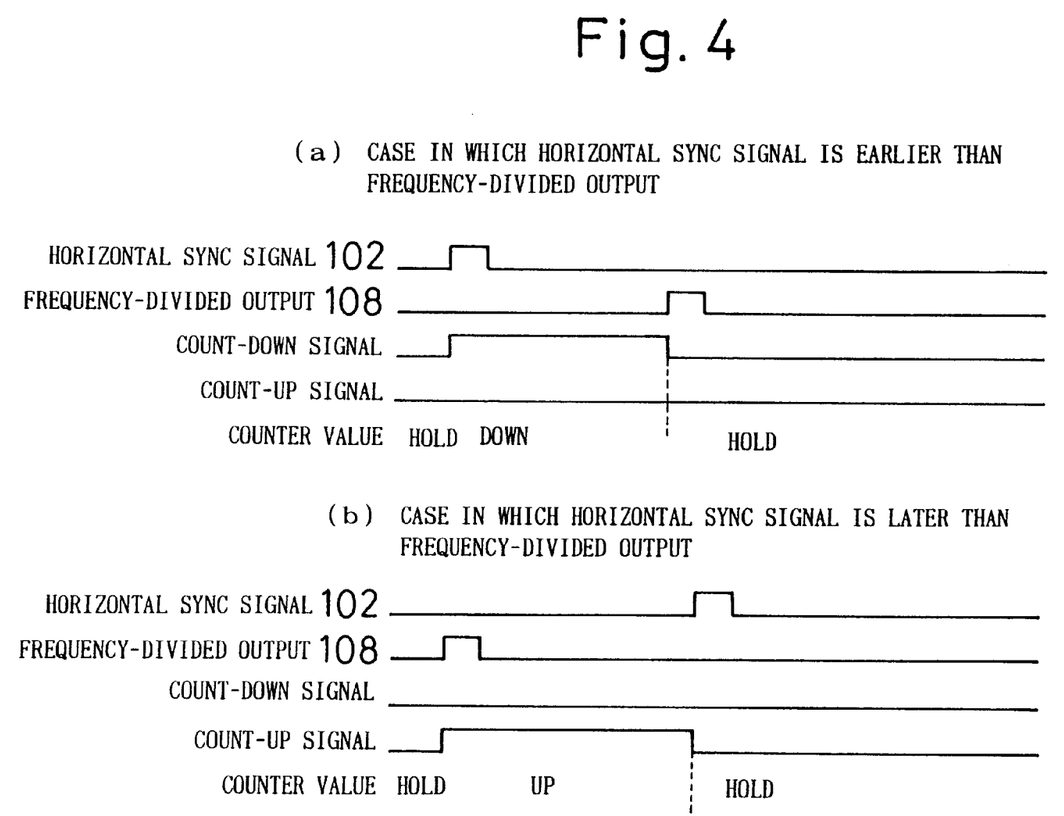
FIG. 4 is a timing diagram that illustrates the operation of a counter.

FIG. 4 is a timing diagram that shows the operation of the phase comparator circuit 6 and the counter 11. The phase comparator 6 compares the edge at which the horizontal synchronization signal 102 that is input and the frequency-divided output signal 108 change. In the case in which the frequency-divided output signal 108 is later than the horizontal synchronization signal 102, a count down output is output responsive to phase difference therebetween, so that the count value of the counter 11 is decreased (FIG. 4(*a*)), and if the frequency-divided output signal 108 is earlier than the horizontal synchronization signal 102, a count up signal is output responsive to the phase difference therebetween, this causing the count value of the counter 11 to be increased (FIG. 4(*b*)).

Figure 5:
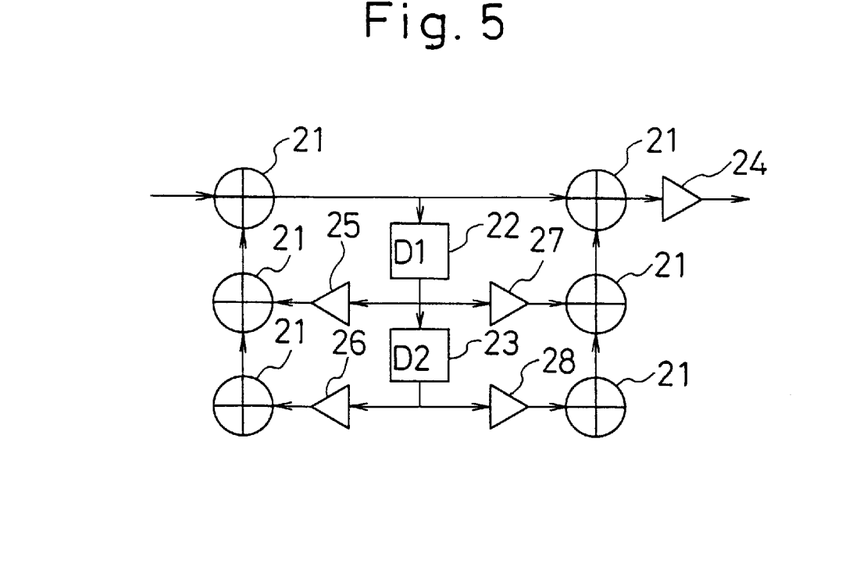
FIG. 5 is a block diagram that shows an example of a digital filter.

FIG. 5 is a block diagram that shows a specific example of a digital filter. The digital filter used in this embodiment is an infinite impulse response digital filter, which is formed by an adder 21, multipliers 24 through 28, and delay circuits 22 and 23. The delay circuits 22 and 23 each provide a delay of one period of the horizontal synchronization signal, and the multipliers 24 through 28 are each used to set the filter coefficients so as to obtain the required filter characteristics.

Figure 6:
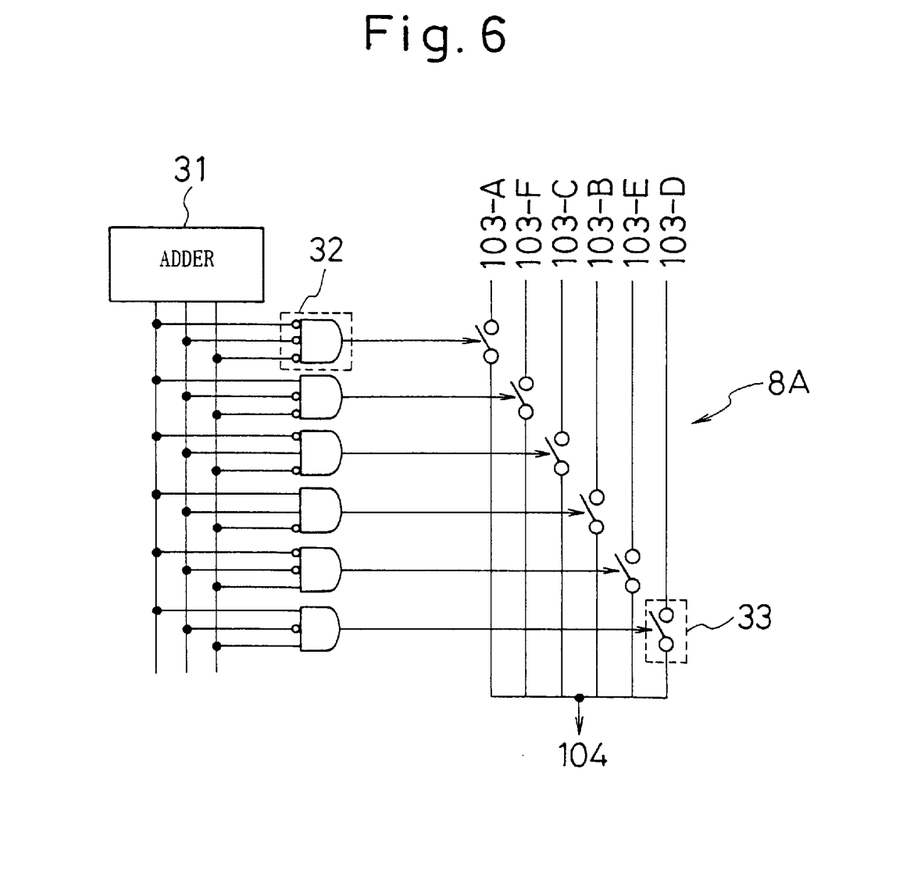
FIG. 6 is a block diagram that shows the main parts of a signal switching circuit.
Figure 7:
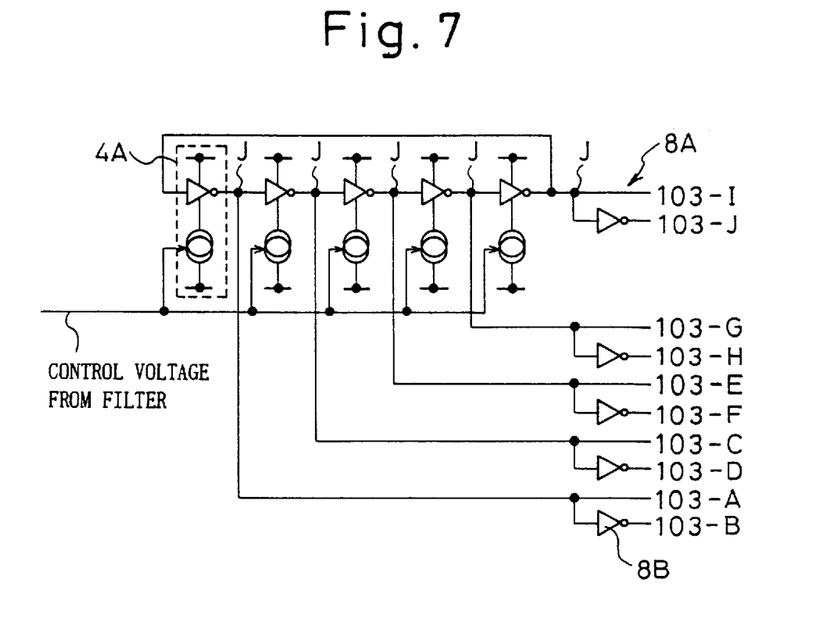
FIG. 7 is a circuit diagram that shows another specific configuration of a voltage-controlled oscillator.

FIG. 6 shows a signal selecting circuit, this signal selecting circuit 8 being formed by an adder 31 that adds the value of the counter 11 and the compensation data that the adder 31 had, AND circuits 32 that control the switches (switching means) 33 based on the data in the adder 31, and the switches 33. The output value from the digital filter 7 is set to the adder 31 and add or subtract once for each period of the horizontal synchronization signal, and a reference clock 103 is selected.

Therefore, each time the horizontal input signal 102 is input, a signal 103 of the signal generation circuit 8A is selected by the signal selecting circuit 8 based on the value (positive or negative) of the counter 11, and this signal is fed to the 1/M frequency divider circuit 9, so that control is performed so as to quickly eliminate the phase difference at the phase comparator circuit 6, the result being that the system clock 104 is output in synchronization with the horizontal synchronization signal 102 at all times.

Thus, in a digital PLL circuit according to the present invention, a phase comparison is performed in the second digital PLL circuit 52 in synchronization with the horizontal synchronization signal 102, a phase comparison of clock 103 being performed by the first digital PLL circuit between two of the horizontal synchronization signals, and phase control is performed, the result being an increase in the frequency of the phase control, and an improvement in the clock accuracy.

It is necessary to configure the circuit so that the following relationship between the allowable jitter time of the system clock 104, oscillation period of the crystal oscillator circuit 1, the divisor of the 1/N frequency divider circuit 5, and the number of inverter circuit stages obtains.

Allowable system clock 104 jitter time

>(Crystal oscillator period)/{(Divisor of 1/N frequency divider 5)×(Number of inverter circuit stages in VCO 4)×2}

For example, if the allowable jitter time of the system clock 104 is 1.0 ns, the frequency of the crystal oscillator 1 is 21 MHz, the divisor of the 1/N frequency divider circuit 5 is 8, and the number of inverter stages in the VCO 4 is 3, the oscillation frequency of the VCO 4 would be 164 MHz, the phase difference between the six reference clock signals 103 being 0.99 ns, the system clock of jitter time of 1.0 ns or less being obtained.

Figure 8:
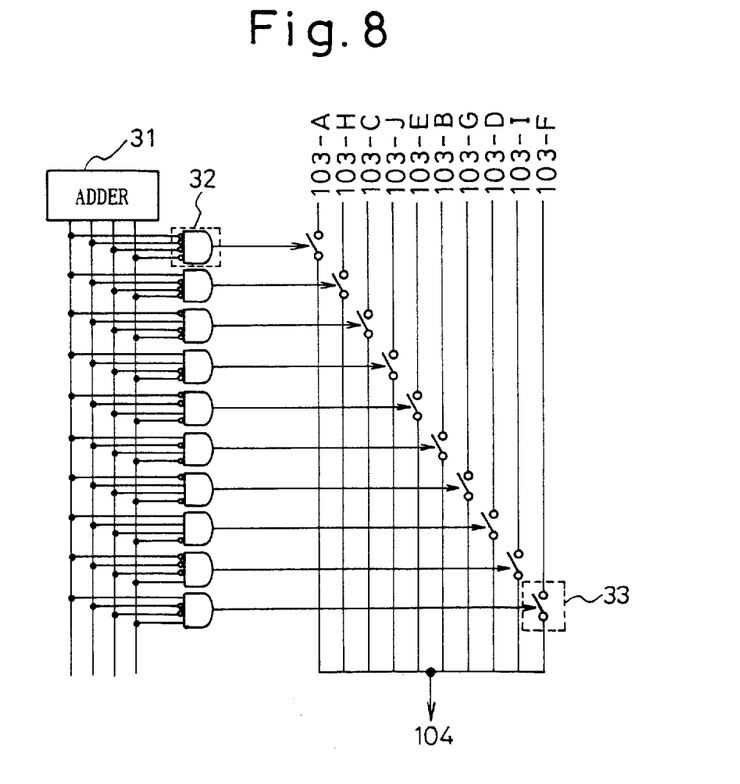
FIG. 8 is a block diagram that shows another specific example of a signal switching circuit.

FIG. 8 is another example of the present invention, in which there are five stages of inverter circuits, and in which the 10 reference clocks have a mutual phase difference of 36 degrees between them, in the sequence of 103-A, 103-H, 103-C, 103-J, 103-E, 103-B, 103-G, 103-D, 103-I, 103-F, the adder 31 performing adding and subtracting of one decimal digital.

Therefore, it is sufficient for the number of inverter circuits to be an odd number of 3 or greater.

By adopting the constitution as described in detail above, in the present invention by setting the divisor to approximately 8 (divide-by-8) in the 1/N frequency divider circuit 5 of the first digital PLL circuit 51, there is an increase in the frequency at which control by phase comparison is performed with respect to the reference clock, thereby enabling the generation of a reference clock of high accuracy and the display of a high-quality image.

What is claimed is:

1. A digital PLL circuit comprising:

a PLL circuit comprising a reference oscillator, a voltage-controlled oscillator and a 1/N frequency divider dividing the oscillation output of said voltage-controlled oscillator by means of said 1/N frequency divider, comparing the phases of an output signal of said 1/N frequency divider and an output signal of said reference oscillator, controlling the oscillator frequency of said voltage-controlled oscillator, and extracting an oscillation output of said voltage-controlled oscillator;

a signal generation circuit generating a plurality of output signals having the same frequency as a frequency from said voltage-controlled oscillator of said PLL circuit but differing phase; and a phase detection circuit comprising a signal selecting circuit that is capable of selecting a signal from said signal generation circuit, a variable frequency divider circuit that divides the frequency of an output of said signal selecting circuit, said output of said signal selecting circuit being also an output of said digital PLL circuit, a phase comparator circuit that compares the phases of a reference signal and the output signal from said variable frequency divider circuit, an up/down counter that detects a difference in phase of said phase comparator circuit, a digital filter that is provided between said up/down counter and said signal selecting circuit, said phase detection circuit selecting the signal from said signal generation circuit based on the output of said up/down counter;

wherein in said phase detection circuit a clock that is synchronized with the phase of said reference signal is obtained by said phase detection circuit, and said oscillation output is phase-compared N times by said PLL circuit in a time between two of said reference signals of said phase detection circuit.

2. The digital PLL circuit according to claim 1, wherein said reference signal in said phase detection circuit is a horizontal synchronization signal.

3. A digital PLL circuit comprising:
a PLL circuit comprising a reference oscillator, a voltage-controlled oscillator and a 1/N frequency divider dividing the oscillation output of said voltage-controlled oscillator by means of said 1/N frequency divider, comparing the phases of an output signal of said 1/N frequency divider and an output signal of said reference oscillator, controlling the oscillator frequency of said voltage-controlled oscillator, and extracting an oscillation output of said voltage-controlled oscillator;

a signal generation circuit generating a plurality of output signals having the same frequency as a frequency from said voltage-controlled oscillator of said PLL circuit but differing phase; and a phase detection circuit comprising a signal selecting circuit that is capable of selecting a signal from said signal generation circuit a variable frequency divider circuit that divides the frequency of an output of said signal selecting circuit, a phase comparator circuit that compares the phases of a reference signal and the output signal from said variable frequency divider circuit, an up/down counter that detects a difference in phase of said phase comparator circuit, a digital filter that is provided between said up/down counter and said signal selecting circuit, said phase detection circuit selecting the signal from said signal generation circuit based on the output of said up/down counter;

wherein in said phase detection circuit a clock that is synchronized with the phase of said reference signal is obtained by said phase detection circuit, and said oscillation output is phase-compared N times by said PLL circuit in a time between two of said reference signals of said phase detection circuit wherein said voltage-controlled oscillator of said PLL circuit is formed by a loop connection of an odd number of inverter circuits in cascade, and said PLL circuit being formed such as to satisfy the following relationship between the allowable jitter time of said clock, an oscillation period of said reference oscillator thereof, the divisor of said 1/N frequency divider circuit, and the number of inverter circuit stages of said voltage-controlled oscillator (VCO) thereof, wherein the allowable clock jitter time >(Reference oscillator period){(Divisor of 1/N frequency divider)× (Number of inverter circuit stages in VCO)×2}.

4. The digital PLL circuit according to claim 3, wherein said signal generation circuit is configured so as to extract several signals having differing phases from connection lines between said inverter circuits, and said signals of differing phase by 180 degrees are extracted from said connection lines.

5. A digital PLL circuit comprising:
a PLL circuit comprising a reference oscillator, a voltage-controlled oscillator and a 1/N frequency divider which divisor is unvaried, said 1/N frequency divider dividing an oscillation output of said voltage-controlled oscillator comparing the phases of an output signal of said 1/N frequency divider, comparing the phases of an output signal of said 1/N frequency divider and an output signal of said reference oscillator, controlling the oscillation frequency of said voltage-controlled oscillator, and extracting an oscillation output of said voltage-controlled oscillator;

a signal generation circuit generating a plurality of output signals having the same frequency as a frequency from said voltage-controlled oscillator of said PLL circuit but differing phase;

a phase detection circuit comprising a signal selecting circuit that is capable of selecting a signal from said signal generation circuit, a variable frequency divider circuit that divides the frequency of an output of said signal selecting circuit, said output of said signal selecting circuit being also an output of said digital PLL circuit a phase comparator circuit that compares the phases of a reference signal and the output signal from said variable frequency divider circuit, an up/down counter that detects a difference in phase of said phase comparator circuit, a digital filter that is provided between said up/down counter and said signal selecting circuit, said phase detection circuit selecting the signal from said signal generation circuit based on the output of said up/down counter; and a frequency detection circuit detecting a frequency of said reference signal of said phase detection circuit, and controlling said variable frequency divider circuit provided in said phase detection circuit based on a detection result obtained by said frequency detection circuit;

wherein in said phase detection circuit a clock that is synchronized with the phase of said reference signal is obtained by said phase detection circuit, and said oscillation output is phase-compared N times by said PLL circuit in a time between two of said reference signals of said phase detection circuit.

6. The digital PLL circuit according to claim 5, wherein said signal selecting circuit includes a switching means selecting one signal from a plurality of signals having differing phases, said signals being output from said signal generation circuit.

7. The digital PLL circuit according to claim 5, wherein said reference signal in said PLL circuit is a horizontal synchronization signal.

8. A digital PLL circuit comprising:
a PLL circuit comprising a reference oscillator, a voltage-controlled oscillator and a 1/N frequency divider which divisor is unvaried, said 1/N frequency divider dividing an oscillation output of said voltage-controlled oscillator comparing the phases of an output signal of said 1/N frequency divider, comparing the phases of an output signal of said 1/N freqcuency divider and an output signal of said reference oscillator, controlling the oscillation frequency of said voltage-controlled oscillator, and extracting an oscillation output of said voltage-controlled oscillator;

a signal generation circuit generating a plurality of output signals having the same frequency as a frequency from said voltage-controlled oscillator of said PLL circuit but differing phase;

a phase detection circuit comprising a signal selecting circuit that is capable of selecting a signal from said signal generation circuit, a variable frequency divider circuit that divides the frequency of an output of said signal selecting circuit, a phase comparator circuit that compares the phases of a reference signal and the output signal from said variable frequency divider circuit, an up/down counter that detects a difference in phase of said phase comparator circuit, a digital filer that is provided between said up/down counter and said signal selecting circuit, said phase detection circuit selecting the signal from said signal generation circuit based on the output of said up/down counter; and a frequency detection circuit detecting a frequency of said reference signal of said phase detection circuit, and controlling said variable frequency divider circuit provided in said phase detection circuit based on a detection result obtained by said frequency detection circuit;

wherein in said phase detection circuit a clock that is synchronized with the phase of said reference signal is obtained by said phase detection circuit, and said oscillation output is phase-compared N times by said PLL circuit in a time between two of said reference signals of said phase detection circuit, and wherein said voltage-controlled oscillator of said PLL circuit is formed by a loop connection of an odd number of inverter circuits in cascade, and said digital PLL circuit being formed so as to satisfy the following relationship between the allowable jitter time of said clock, an oscillation period of said reference oscillator thereof, the divisor of said 1/N frequency divider circuit, and the number of inverter circuit stages of said voltage-controlled oscillator (VCO) thereof, wherein the allowable clock jitter time >(Reference oscillator period){(Divisor of 1/N frequency divider)×(Number of inverter circuit stages in VCO)×2}.

9. The digital PLL circuit according to claim 8, wherein said signal generation circuit is configured so as to extract several signals having differing phases from connection lines between said inverter circuits, and said signals of differing phase by 180 degrees are extracted from said connection lines.

10. A clock generation method of a digital PLL circuit comprising a PLL circuit having a voltage-controlled oscillator and an unvaried frequency divider, a phase detection circuit having a variable frequency divider and detecting a phase of an output signal of said PLL circuit, and a frequency detection circuit detecting a frequency of a reference signal of said phase detection circuit, the method comprising:

a step of controlling said variable frequency divider provided in said phase detection circuit based on a detection result obtained by said frequency detection circuit;

a step of dividing an oscillation output of said PLL circuit by said unvaried frequency divider of said PLL circuit, and generating a plurality of output signals having the same frequency as a frequency from said voltage-controlled oscillator of said PLL circuit but differing phase;

a step of comparing a phase between a reference signal of said phase detection circuit and an output signal from said variable frequency divider of said phase detection circuit and detecting a phase difference between said two signals; and a step of selecting a signal from said plurality of output signals so as to eliminate said phase difference between said output signal of said variable frequency divider of said phase detection circuit and said reference signal of said phase detection circuit, based on said phase detection result, said signal selected from said plurality of output signals being also an output of said digital PLL circuit.

* * * * *